United States Patent [19]

Ports

[11] 4,292,730

[45] Oct. 6, 1981

[54] METHOD OF FABRICATING MESA BIPOLAR MEMORY CELL UTILIZING EPITAXIAL DEPOSITION, SUBSTRATE REMOVAL AND SPECIAL METALLIZATION

[75] Inventor: Kenneth A. Ports, Indialantic, Fla.

[73] Assignee: Harris Corporation, Melbourne, Fla.

[21] Appl. No.: 129,913

[22] Filed: Mar. 12, 1980

[51] Int. Cl.³ .................. H01L 21/283; H01L 21/302
[52] U.S. Cl. .................. 29/577 C; 29/578; 29/580; 29/590; 29/591; 148/174; 148/175; 156/647; 156/649; 156/653; 156/657; 357/49; 357/51; 357/59; 357/68; 365/154
[58] Field of Search .................. 29/577 C, 578, 580, 29/590, 591; 156/647, 649, 653, 657; 148/174, 175; 357/49, 50, 51, 59, 68; 365/154

[56] References Cited

U.S. PATENT DOCUMENTS

| | | | |
|---|---|---|---|
| 3,432,919 | 3/1969 | Rosvold | 29/578 |
| 3,480,841 | 11/1969 | Castrucci et al. | 29/577 C X |
| 3,506,502 | 4/1970 | Nakamura | 148/175 X |
| 3,519,901 | 7/1970 | Bean et al. | 357/59 |
| 3,659,162 | 4/1972 | Wada et al. | 357/50 X |
| 4,017,341 | 4/1977 | Suzuki et al. | 29/580 X |
| 4,035,830 | 7/1977 | Kim | 357/65 X |
| 4,131,909 | 12/1978 | Matsuda et al. | 357/49 |
| 4,131,985 | 1/1979 | Greenwood et al. | 156/647 X |
| 4,146,905 | 3/1979 | Appels et al. | 357/59 X |
| 4,189,342 | 2/1980 | Kock | 156/657 X |

*Primary Examiner*—L. Dewayne Rutledge
*Assistant Examiner*—W. G. Saba
*Attorney, Agent, or Firm*—Leitner, Palan, Martin & Bernstein

[57] ABSTRACT

A memory cell having two mesa bipolar transistors separated by a valley in which two doped polycrystalline load resistors are formed. Doped polycrystalline conductors connect the resistors to a respective backside metallic collector contact which is between a support structure and a transistor and to a respective base.

The cell is fabricated by removing a substrate upon which was formed an epitaxial layer and top support, applying a backside metallic layer, forming a bottom support, removing the top support, etching the epitaxial layer to form mesas, etching the backside metal to form discrete contacts, and forming multi-level resistors and conductors in the valley between the mesa transistors separated by insulative material.

5 Claims, 13 Drawing Figures

METHOD OF FABRICATING MESA BIPOLAR MEMORY CELL UTILIZING EPITAXIAL DEPOSITION, SUBSTRATE REMOVAL AND SPECIAL METALLIZATION

BACKGROUND OF THE INVENTION

The present invention relates generally to memory cells and more specifically to bipolar transistor memory cells.

In computing systems or circuit families based upon or utilizing random access memories (RAM's), speed of operation is in general a design consideration. For those systems or circuit families which must operate in a radiative environment, for instance, total gamma and/or gamma dot (short bursts of intense gamma rays), a radiation hardness is a prime design consideration. For high speed and resistance to total gamma irradiation, bipolar RAM's are preferred to RAM's based on insulated gate field effect devices, as these later devices cannot yet be made simultaneously to operate at high speeds and to be resistant to the surface effects induced by the gamma irradiation.

For resistance to gamma dot irradiation, minimization of device and circuit volume is necessary, as the effect of gamma dot irradiation is to generate photocurrents which may disrupt device, circuit and hence system operation, and the magnitude of generated photocurrents are in general proportional to the volume of the integrated circuit so irradiated. The preferred method for minimizing this volume in a bipolar circuit is by dielectrically isolating the individual devices in the circuit and by using other means to reduce the bulk silicon volume associated with the circuitry. An example of this would be the use of thin film resistors in place of diffused resistors.

The basic building block of a RAM circuit is the individual RAM cell which stores one memory bit. In general, the smaller the topological area of this cell, the faster the circuit will operate, and the greater will be the potential manufacturing yield of the RAM. For many practical applications, circuit families utilizing RAM's must be manufacturable at reasonable cost and operate at very high speeds in radiative environments.

Thus, there exists a need for a random access memory cell using bipolar transistors which simultaneously achieves radiation hardness, high speed of operation, and minimum topological area.

SUMMARY OF THE INVENTION

An object of the present invention is to provide a bipolar memory cell which is more radiation hard than previous bipolar memory cells.

Another object is to provide a bipolar memory cell which requires less surface area than previous bipolar memory cells.

A further object of the present invention is to provide a bipolar memory cell which is formed from a minimum volume of semiconductor material.

Still another object of the present invention is to provide a method of fabricating a bipolar memory cell of increased radiation hardness and decreased surface area.

The objects of the invention are attained by forming the pair of bipolar transistors of a memory cell as mesa transistors with polycrystalline load resistors formed in the valley between the mesa transistors. A metallic contact on a support forms the backside collector contact for the mesa transistors. Doped polycrystalline resistors are connected to the respective collector contacts and base regions by doped polycrystalline conductors. The emitters of the mesa transistors are also connected to the conductors of the array by doped polycrystalline conductors. The multi-level resistor and interconnect systems are separated by layers of insulation.

The process for fabricating the mesa bipolar transistor memory cell begins with growing an epitaxial layer on a substrate. A top support is formed on the epitaxial layer and is separated therefrom by an insulative layer. The substrate is removed by electro-chemical etching and a metallic backside layer is applied to the bottom of the epitaxial layer. A bottom support is then formed below the backside metallic layer. The top support is then removed down to the insulative layer and the epitaxial layer is etched to form a plurality of mesas. Base and emitter regions are then formed in individual mesas and the backside metallic layer is patterned to form discrete backside collector contacts for each mesa. An insulative layer is then formed in the valleys between the mesas and a layer of polycrystalline material is deposited, doped and delineated to form polycrystalline resistors and first level interconnects. This is followed by a second layer of insulation and doped polycrystalline material, which is delineated to form second level resistors and innerconnects. A final layer of insulation and a metallic layer are formed and delineated to form the third level interconnects.

Other objects advantages and novel features of the present invention will become apparent from the following detailed description of the invention when considered in conjunction with the accompanying drawings.

DESCRIPTION OF THE PREFERRED EMBODIMENTS

Figure 1:
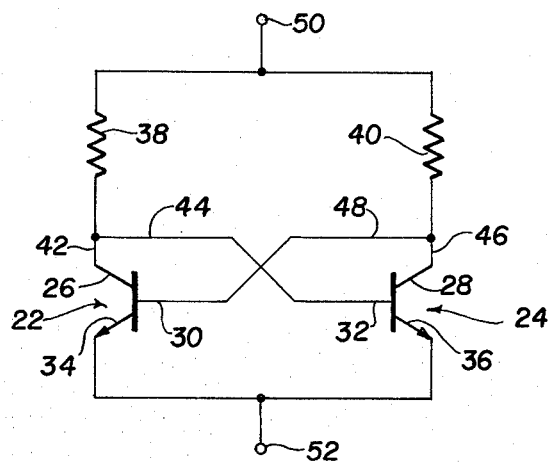
FIG. 1 is a schematic of a basic bipolar transistor memory cell.

A standard bipolar transistor, random access memory cell generally includes a pair of cross-coupled transistors and load impedance for each transistor. As illustrated in FIG. 1, the transistors 22 and 24 include collector 26, 28, base 30, 32 and emitter 34, 36, respectively. The load impedances are illustrated as resistors 38 and 40 connected to collectors 26 and 28 of transistors 22 and 24 by connectors 42 and 46, respectively. Base 32 of transistor 24 is connected to the junction of load resistor 38 and collector 26 of transistor 22 by conductor 44. The base 30 of transistor 22 is connected to the junction of load resistor 40 and collector 28 of transistor 24 by conductor 48. The other end of resistors 38 and 40 are connected to a common terminal or word line 50. Similarly, the emitters 34 and 36 of the transistors 22 and 24 are connected to a common terminal 52.

These elements and interconnections describe the basic RAM memory cell and have various configurations depending upon the technique of storing and sensing the storage state. For example, cell 20 may be programmed or sensed at the junction of the load resistors with the respective collectors, or the transistors 22 and 24 may include a plurality of emitters wherein the sensing or programming is effectuated by these additional emitters. Since the present invention is the integrated circuit and method of fabrication of the basic elements of the bipolar transistor memory cell, only the portions illustrated in schematic FIG. 1 will be discussed. The additional circuitry and devices required for any specific scheme can be used with the schematic of FIG. 1 and the integrated circuit illustrated in FIGS. 2 and 3. It should be noted that FIG. 3 is a schematic topological presentation to illustrate the location of the regions and levels of interconnect and consequently, layers of insulation and conductors have been deleted for sake of clarity.

Figure 2:
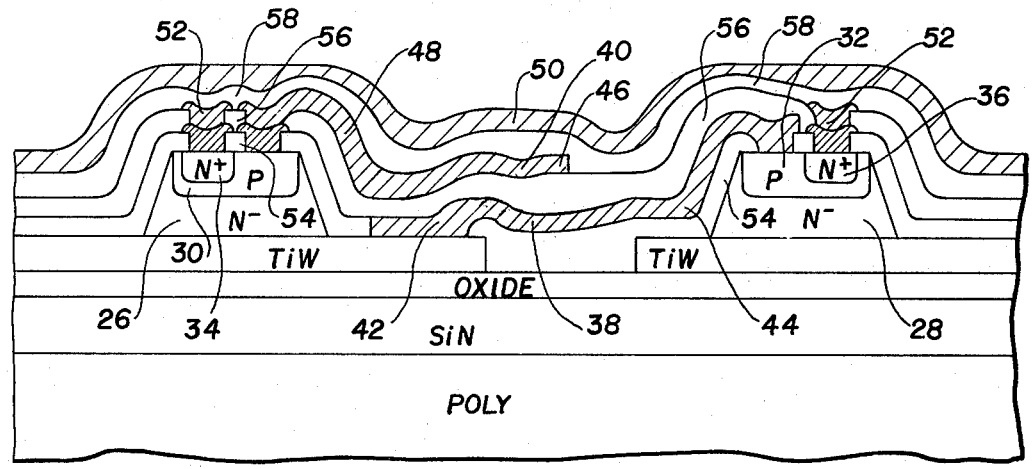
FIG. 2 is a cross-sectional view of an integrated circuit of a bipolar transistor memory cell incorporating the principles of the present invention taken along lines II—II of FIG. 3.
Figure 3:
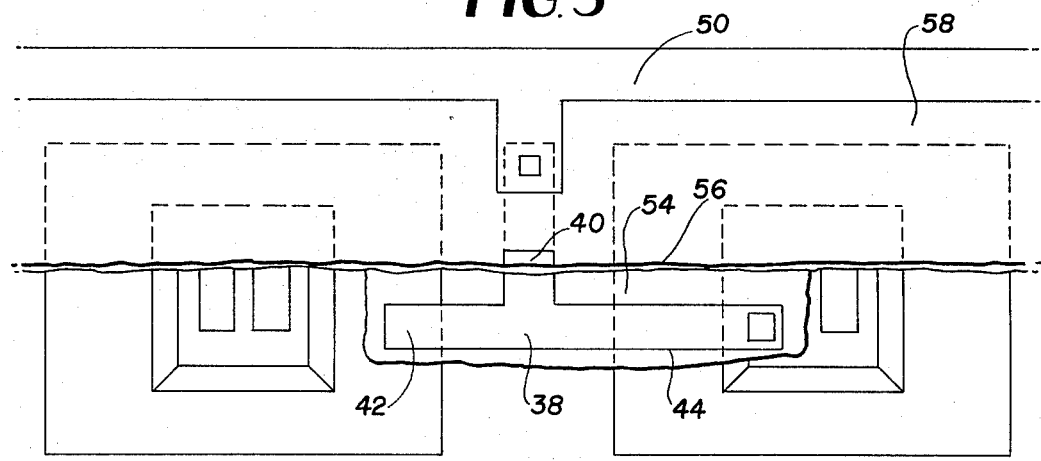
FIG. 3 is a topological view of the integrated circuit of FIG. 2.

As illustrated in FIGS. 2 and 3, resistor 38 and its interconnectors 42 and 44 to collector 26 of transistor 22 and base 32 of transistor 24 form first level interconnect. Additional first level interconnects are made for contacts to emitters 34 and 36 and collector 28 of transistor 24 (not shown). The second level of interconnects includes resistor 40 and interconnects 46 and 48 to first level interconnects collector 28 of transistor 24 and base 30 of transistor 22. The second level of interconnects also includes the common connection for the common terminal 52 of emitters 34 and 36 as well as the common connection of the other end of resistors 38 and 40 (not shown). The third level of interconnects includes the work line 50 which is connected to the other end of resistors 38 and 40. The first level of interconnects is separated from the substrate and mesa transistors by an insulative layer 54, the second level of interconnects is separated from the first level of interconnects by an insulative layer 56 and the third level of interconnects is separated from the second level of interconnects by an insulative layer 58.

Figure 4:
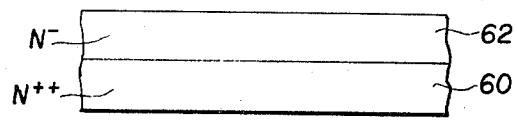
FIGS. 4 through 13 are cross-sectional views of a wafer at various states of fabrication according to the process of the present invention.
Figure 5:
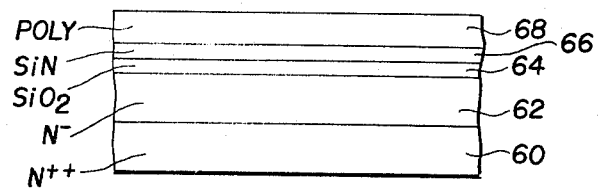
Figure 6:
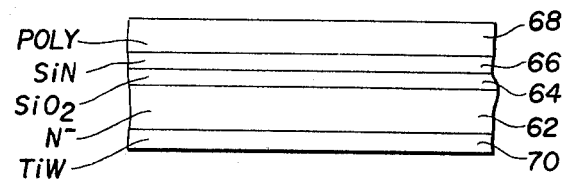

The process to fabricate the integrated circuit illustrated in FIGS. 2 and 3 begins by growing an epitaxial layer 62 on a substrate 60. As illustrated in FIG. 4, substrate 60 may be N conductivity type silicon having a bulk resistance of 0.01 ohm-centimeters with an approximate 0.2 mils epitaxial N conductivity type layer having a resistivity of, for example, 0.2–0.3 ohm-centimeters. A top handle as illustrated in FIG. 5 is then formed on the epitaxial layer 62 by oxidizing the surface thereof to form a silicon dioxide layer 64 of approximately 1,000 angstroms, followed by deposition of a nitride layer 66 of approximately 2,500 angstroms and a polycrystalline layer 68 of approximately 15 mils. After the top support or handle has been formed, the substrate 60 is removed. The removal is preferably by electrochemical etch which provides for a more even control of epitaxial layer 62 thickness and will not introduce any imperfection or stress in the epitaxial layer. Other removal methods may be used, but are not preferred. A metallic layer 70, for example, titanium tungsten is applied to the bottom of epitaxial layer 62 to form the backside metallic contact. Other metals may be used but preferably, the backside metallic layer is a refractory metal. The titanium tungsten is deposited by, for example, sputtering, to have a thickness of 0.5 micron. The structure at this point is illustrated in FIG. 6. To insure an ohmic contact to the epitaxial layer 62, a non-selective, low energy, high dose N-type implant of, for instance, arsenic, followed by a short thermal or laser activation process may be performed before the application of the refractory metal. Deletion of this implant can yield Schottky barrier diodes as collector contacts, and, while inappropriate for the example presented here, could have application elsewhere, for instance, in a RAM cell based on integrated Schottky logic devices and circuitry.

Figure 7:
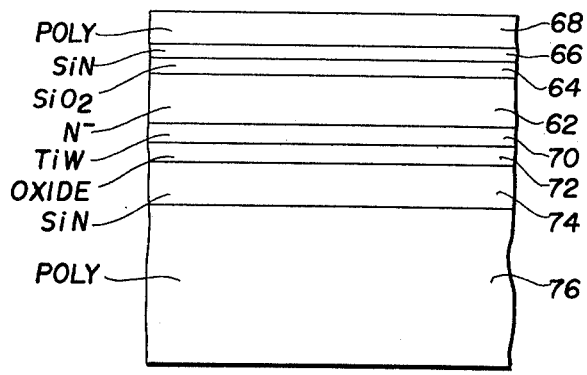

On the bottom of the backside contact layer 70, a bottom handle or support as illustrated in FIG. 7 is formed. This includes depositing a layer of oxide 72 on the titanium tungsten layer 70, a nitride layer 74 on the oxide layer 72 and a polycrystalline layer 76. The oxide layer 72 may have a thickness of approximately 0.5 microns, the nitride layer 74 may have a thickness of 2000 A° and the polycrystalline layer 76 may have a thickness of 15 mils. It should be noted that the back support or handle may be formed of more or fewer layers than illustrated in FIG. 7 and may include any desired material. For example, the oxide layer 72 may be deleted.

Figure 8:
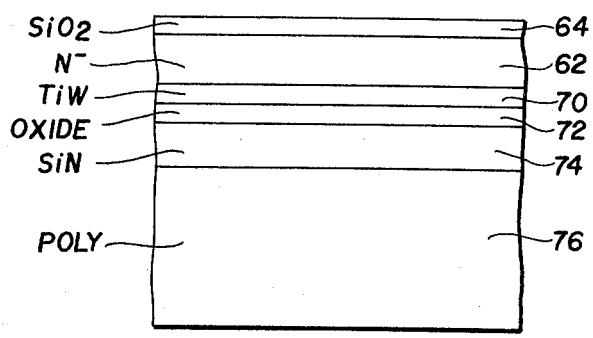
Figure 9:
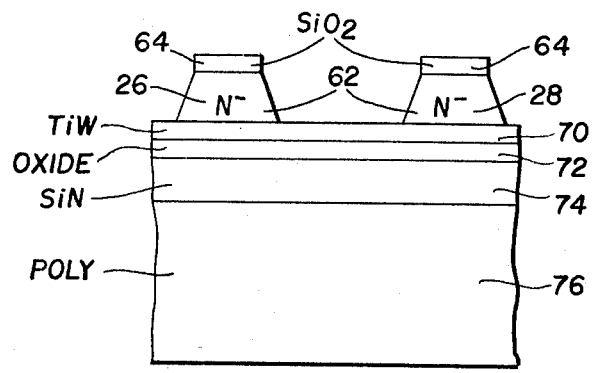

The top handle is removed by, for example, grinding or etching the polycrystalline layer 68 down to the nitride 66 which acts as a grinding stop. Layer 66 is then removed by etching to leave an undamaged layer 64 on the top surface of epitaxial layer 62. The resulting structure is illustrated in FIG. 8. The wafer is then masked and subjected to an anisotropic etch to form a plurality of mesas resting upon the backside metallic layer 70. The masking is performed using a well known technique which includes forming a photoresistive layer, patterning the layer, and then etching the patterned layer. The apertures formed in the mask are large enough such that the etchant, for example, KOH+-H$_2$O, will etch the epitaxial layer 62 at an angle along the [111] plane so as to form a truncated V. This results in the mesa pattern having exposed portions of backside metal contact 70 at the bottom of valleys formed between the mesa regions. The resulting structure is illustrated in FIG. 9.

Figure 10:
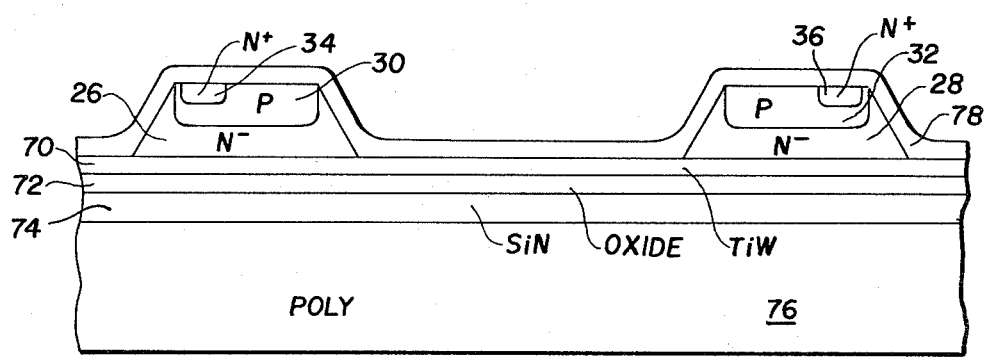

An additional oxide layer 78 is formed on the wafer and used as the impurity introduction and diffusion mask for forming the base and emitter regions. Base apertures are formed in layer 78 and P type impurities are introduced through the aperture and diffused therein to form base regions 30 and 32. This is followed by forming additional apertures in oxide further deposited either during the previous diffusion or by separate oxidation step. N type impurities are then introduced through the emitter apertures in the oxide and diffused to form emitter regions 34 and 36. Further oxide is deposited to cover the emitter apertures. The wafer covered with an oxide layer 78 is illustrated in FIG. 10. The impurities may be introduced by deposition or ion implantation.

Figure 11:
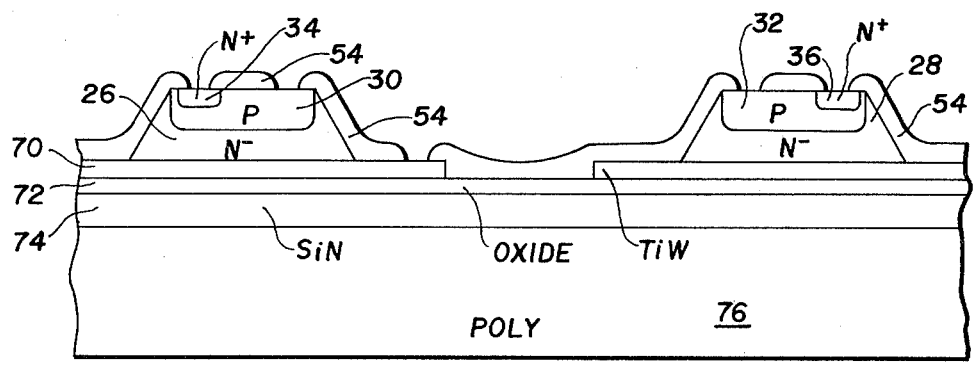

The oxide layer 78 is then patterned to form apertures which will be used to etch the backside metallic layer 70 to form discrete backside contacts for each of the mesas 26 and 28. After openings are formed in oxide layer 78 an etchant, for example, hydrogen peroxide solution is used which preferentially etches the exposed titanium tungsten backside layer 70. The masking layer 78 is then removed and a first insulative layer 54, for example, silicon dioxide is deposited over the surface of the substrate. The oxide layer 54 is patterned to form apertures to backside metallic layer 70, base regions 30 and 32 and emitter regions 34 and 36. The resulting structure is illustrated in FIG. 11.

Although the process for forming the bipolar transistors and discrete backside contacts has been described forming the base and emitter regions followed by patterning the backside metal layer 70, the order of fabrication may be reversed. By forming the base and emitter regions last, the emitter mask layer 78 may be used as the first insulating layer 54. The emitter apertures would be washed and the additional apertures for the base and backside metal contact regions would be formed.

Figure 12:
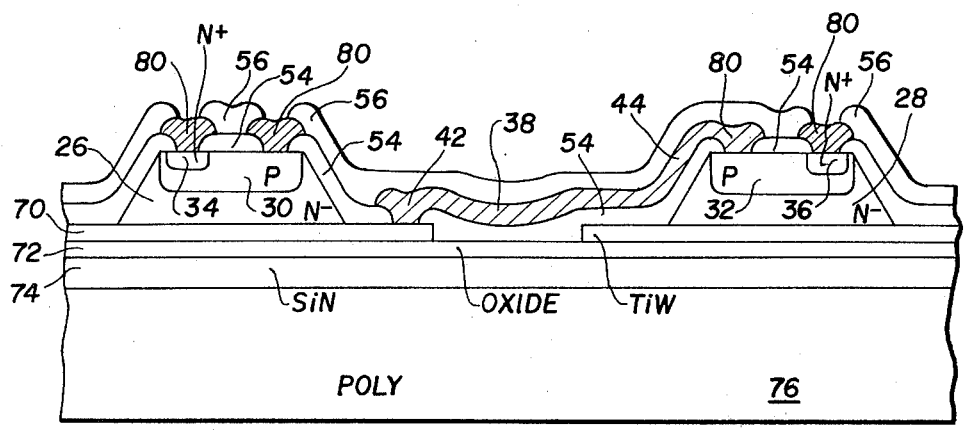

An interconnect layer 80 of, for example, polycrystalline silicon is applied to the wafer and doped with impurities to have a resistance equal to that required for resistor 38. For example, phosphorus impurities are introduced to have an impurity concentration of $9 \times 10^{14}$ ions per centimeters squared to define a resistance of 3000 ohms per square. Polycrystalline layer 80 is then masked and delineated to form the first interconnect layer which includes resistor 38 and its interconnects 42 and 44 to backside metal of collector 26 and base region 32, respectively, and first level contacts to the backside metal for collector 28 (not shown), emitter regions 34 and 36 and base region 30. The resistor 38 is then masked and the remaining polycrystalline material is additionally doped to define low resistance conductors having a resistance of approximately 10 ohms per square. The wafer is then covered by a second insulating or oxide layer 56 which is patterned to define the apertures to the first level contacts for the collector 28, emitter regions 34 and 36, base region 30 and the other end of resistor 38 (not shown). The resulting structure is illustrated in FIG. 12.

Figure 13:
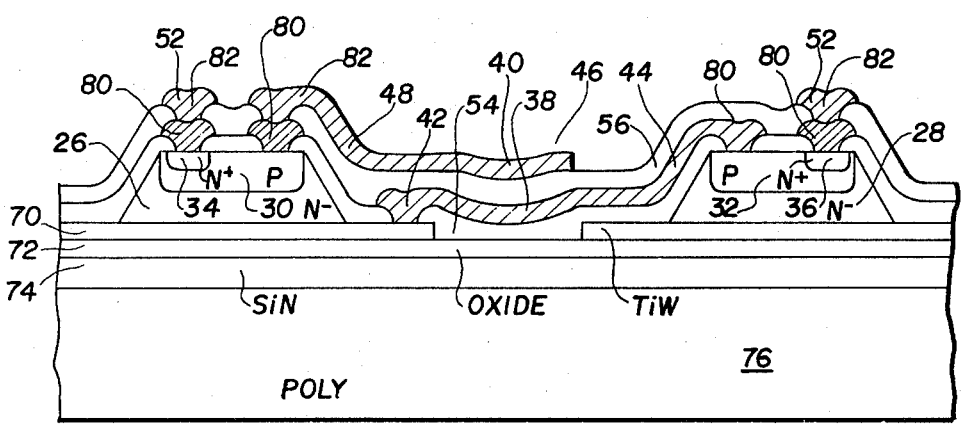

A layer of polycrystalline material 82 is then applied over the wafer and doped to have the resistance required for resistor 40. As in the first level of interconnects, polycrystalline layer 82 is masked and delineated to define the resistor 40, interconnects 46 and 48 and common emitter interconnect and terminal 52. Resistor 40 is then masked and the exposed delineated portions of polycrystalline layer 82 is again doped to define a low resistance conductor. The resulting structure is illustrated in FIG. 13.

The top insulative layer 58 is then applied over the substrate. Apertures are formed therein to form a contact to the other end of resistor 40 which is connected to resistor 38. The top interconnect level, which may be metallic or polycrystalline, is then applied and delineated to form the word line contact 50. This results in the structure of FIG. 2.

As discussed previously, only the specific structure of the schematic of FIG. 1 is illustrated in the method of fabricating a pair of bipolar mesa transistors having a pair of polycrystalline resistors formed in the valley there between. Additional interconnects may be formed in the three layer system described. Although polycrystalline is preferred for the first and second interconnect levels, other types of materials may be used. This would increase the number of masking and delineation steps to form doped polycrystalline resistors with metallic interconnects, and consequently, the polycrystalline material is preferred for simultaneous formation of resistor and interconnects. The interconnect system is but one example of that which may be used to effectuate the connection of the schematic of FIG. 1.

It can be seen that the structure of the present invention is an improvement over that of the prior art by using the mesa structure, the volume of the device is drastically reduced to one half of the volume which is produced by prior art bipolar RAM cells. By drastically reducing the volume of the device, the radiation hardness to gamma radiation is substantially increased. The volume reduction is a function of the mesa structure and the use of the backside collector contact.

Although the present process has been described for the information of RAM cells, it is obvious that it may be used to form other circuits using mesa bipolar transistors with interconnect or load resistors in the valleys between the mesa devices.

From the preceding description of the preferred embodiment, it is evident that the objects of the invention are attained in that an improved radiation hard bipolar RAM cell is produced. Although the invention has been described and illustrated in detail, it is to be clearly understood that the same is by way of illustration and example only and is not to be taken by way of limitation. The spirit and scope of this invention are to be limited only by the terms of the appended claims.

What is claimed:

1. In a method of fabricating an integrated circuit having mesa devices including forming an epitaxial layer on a substrate, forming a top support on said epitaxial layer and removing said substrate, the improvement comprising:
    applying a backside metallic layer to the bottom of said epitaxial layer;
    forming a bottom support on said backside metallic layer;
    removing said top support;
    etching said epitaxial layer to form a plurality of discrete mesa;
    etching said backside metallic layer to form a discrete backside contact for each mesa;
    forming a first top insulative layer;
    applying first interconnect layer and delineating to form interconnects on said first insulating layer between said mesa and contacts to said mesa;
    forming a second top insulative layer; and
    applying a second interconnect layer and delineating to form interconnects on said second insulating layer between said mesa and contacts to surface regions of said mesa.

2. The method according to claim 1 wherein said first interconnect layer is a polycrystalline semiconductor and including doping said polycrystalline layer and delineating to form interconnects and resistors.

3. The method according to claim 1 including diffusing impurities of a first conductivity type into the epitaxial mesa of a second conductivity type opposite said first conductivity type to form a first PN junction and diffusing impurities of said second conductivity type into the region formed by diffusing said first conductivity impurities to form a second PN junction.

4. The method according to claim 1 wherein said bottom support is formed by applying a backside insulative layer to said backside metallic layer and applying a polycrystalline semiconductor layer to said backside insulative layer.

5. The method according to claim 1 wherein said substrate is totally removed by electro-chemical etching.

* * * * *